US012681089B2

(12) United States Patent
Honkura et al.

(10) Patent No.: US 12,681,089 B2
(45) Date of Patent: Jul. 14, 2026

(54) BATTERY CONTROL APPARATUS

(71) Applicant: Vehicle Energy Japan Inc., Hitachinaka (JP)

(72) Inventors: Kohei Honkura, Hitachinaka (JP); Kei Sakabe, Hitachinaka (JP)

(73) Assignee: VEHICLE ENERGY JAPAN INC., Hitachinaka (JP)

( * ) Notice: Subject to any disclaimer, the term of this patent is extended or adjusted under 35 U.S.C. 154(b) by 716 days.

(21) Appl. No.: 17/617,251

(22) PCT Filed: Jun. 4, 2020

(86) PCT No.: PCT/JP2020/022182
§ 371 (c)(1),
(2) Date: Dec. 7, 2021

(87) PCT Pub. No.: WO2020/246558
PCT Pub. Date: Dec. 10, 2020

(65) Prior Publication Data
US 2022/0236329 A1 Jul. 28, 2022

(30) Foreign Application Priority Data
Jun. 7, 2019 (JP) ................................. 2019-107482

(51) Int. Cl.
G01R 31/367 (2019.01)
G01R 31/392 (2019.01)
(Continued)

(52) U.S. Cl.
CPC ......... G01R 31/367 (2019.01); G01R 31/392 (2019.01); H01M 10/48 (2013.01); H02J 7/82 (2026.01); H01M 2010/4271 (2013.01)

(58) Field of Classification Search
None
See application file for complete search history.

(56) References Cited

U.S. PATENT DOCUMENTS 10,955,479 B2    3/2021  Nakao et al.
2015/0369873 A1*  12/2015  Nakao ................... G01R 31/392
                                              702/63
(Continued)

FOREIGN PATENT DOCUMENTS

DE    11 2017 002 072 T5    1/2019
JP         2013-044598      3/2013
JP           5694088 B2     4/2015

OTHER PUBLICATIONS

Extended European Search Report dated May 22, 2023 issued in European Patent Application No. 20819382.1, 6 pages.
(Continued)

*Primary Examiner* — Raymond L Nimox
(74) *Attorney, Agent, or Firm* — FOLEY & LARDNER LLP

(57) ABSTRACT

A battery controller is designed to: estimate a state of health of a battery/batteries on the basis of battery data including a relation between a DC resistance component and a state of charge and a relation between a polarization resistance component and the state of charge; and controls the battery/batteries by referring to the battery data and extracting the relation between the DC resistance component and the state of charge and the relation between the polarization resistance component and the state of charge on the basis of the estimated current state of health of the battery/batteries.

8 Claims, 6 Drawing Sheets

(51) Int. Cl.
     _H01M 10/42_          (2006.01)
     _H01M 10/48_          (2006.01)
     _H02J 7/82_           (2026.01)

(56)                    References Cited

U.S. PATENT DOCUMENTS

2019/0067954 A1* 2/2019 Ohkawa .................. B60L 58/12
2019/0288344 A1* 9/2019 Nakao ................ G01R 31/3648

OTHER PUBLICATIONS

First Office Action dated May 10, 2023 issued in Chinese Patent Application No. 202080042059.0, with English Machine Translation, 9 pages.
International Search Report of International Application No. PCT/JP2020/022182 dated Aug. 18, 2020.

* cited by examiner

FIG. 5

| SOH (%) | SOC (%) | TEMPERATURE T(°C) | ELECTRIC CURRENT (A) | OCV (V) | DC RESISTANCE Ro(Ω) | POLARIZATION RESISTANCE Rp(Ω) | POLARIZATION CAPACITY Cp(F) |
|---|---|---|---|---|---|---|---|
| $SOH_1$ | $SOC_1$ | $T_1$ | $I_1$ | $V_{1111}$ | $Ro_{1111}$ | $Rp_{1111}$ | $Cp_{1111}$ |
| $SOH_1$ | $SOC_1$ | $T_1$ | $I_2$ | $V_{1112}$ | $Ro_{1112}$ | $Rp_{1112}$ | $Cp_{1112}$ |
| * | * | * | * | * | * | * | * |
| * | * | * | * | * | * | * | * |
| * | * | * | * | * | * | * | * |
| * | * | * | * | * | * | * | * |
| $SOH_N$ | $SOC_M$ | $T_L$ | $I_{K-1}$ | $V_{NML(K-1)}$ | $Ro_{NML(K-1)}$ | $Rp_{NML(K-1)}$ | $Cp_{NML(K-1)}$ |
| $SOH_N$ | $SOC_M$ | $T_L$ | $I_K$ | $V_{NMLK}$ | $Ro_{NMLK}$ | $Rp_{NMLK}$ | $Cp_{NMLK}$ |

SOC (%)

SOC (%)

BATTERY CONTROL APPARATUS

TECHNICAL FIELD

The present invention relates to a battery control apparatus in which many batteries are built, such as an electrical storage apparatus for mobile bodies, an electrical storage apparatus for stabilization of system interconnection, and an emergency electrical storage apparatus.

BACKGROUND ART

In order to derive the performance of the battery control apparatus, the state of charge (SOC) of batteries, the state of health (SOH) of the batteries, a chargeable-dischargeable maximum current (an allowable current value), and so on have to be determined appropriately. The internal state of the batteries and parameters for the batteries such as an open circuit voltage (OCV) and internal resistance of the batteries are required in order for the battery control apparatus to calculate the maximum current. Particularly, with the electrical storage apparatus for mobile bodies or for stabilization of system interconnection, in which an irregular electric current is always flowing, internal resistance (polarization resistance) which causes voltage changes when the electric current is kept flowing has considerable influence in addition to internal resistance (DC resistance) which causes voltage changes that occur at the moment when the electric current is made to flow through the batteries.

Parameters such as the DC resistance and the polarization resistance change due to the SOC of the batteries and the temperature. So, a battery controller retains information indicating what values the parameters such as the DC resistance and the polarization resistance would become at various SOC and temperatures, as a data table or their function(s). Then, the battery controller estimates the SOC on the basis of information sent from a cell controller and then identifies the values of the parameters according to the data table or the functions.

Meanwhile, these parameters are determined in an initial state of the batteries, so that if the batteries degrade, values of the parameters which are different from actual values may be output from the data table or the function(s) and the SOC, a battery voltage value, an allowable current value, and so on cannot be calculated accurately.

The battery controller decides a resistance increase rate according to the SOH of the batteries in order to correct the influence by the degradation of the batteries and decides the DC resistance and the polarization resistance after the degradation by multiplying the DC resistance and the polarization resistance in the initial state of the batteries by the resistance increase rate. Regarding a battery module or a battery pack in which a plurality of battery cells are connected in series or in parallel, the SOH of all the battery cells is decided and an allowable current value of the battery module or the battery pack is calculated by using the resistance increase rate of a battery cell which has been most degraded.

It is proposed to update the data table of a DC resistance component(s) and a polarization resistance component(s) according to the degradation of the batteries. For example, PTL 1 discloses a learning-type algorithm for a degradation management system, which retains the data table of the DC resistance and a diffusion coefficient in the initial state and updates a part of the data table that corresponds to the measured SOC and temperature according to a measured value of a battery voltage waveform during charging/discharging, and values of the DC resistance and the diffusion coefficient which are identified by calculation based on a specified battery model.

CITATION LIST

Patent Literature

PTL 1: Japanese Patent Application Laid-Open (Kokai) Publication No. 2013-44598

SUMMARY OF THE INVENTION

Problems to be Solved by the Invention

The DC resistance and the polarization resistance when the batteries have degraded do not necessarily rise uniformly regarding all the SOC; and in a certain SOC, the DC resistance or the polarization resistance may sometimes decrease along with the degradation of the batteries. The DC resistance and the polarization resistance of a battery derived from the DC resistance and the polarization resistance of a positive electrode and a negative electrode which constitute the battery. The DC resistance or the polarization resistance of the positive electrode and the negative electrode has dependency on the SOC of each of the positive electrode and the negative electrode and the SOC dependency of the DC resistance or the polarization resistance of the battery is determined by a correspondence relationship of the SOC of the positive electrode and the negative electrode.

On the other hand, the correspondence relationship of the SOC of the positive electrode and the negative electrode changes along with the degradation of the battery. Accordingly, the SOC dependency of the DC resistance or the polarization resistance of the battery changes and the DC resistance or the polarization resistance decreases due to the degradation, depending on the SOC. Therefore, if the allowable current value is decided in accordance with a battery cell which has been most degraded, it may sometimes deviate from the allowable current of a battery cell whose degradation has not progressed, and the degradation of the battery cell may be accelerated.

Even when a plurality of battery cells with different degrees of degradation are connected in series, it is an object of the present invention to provide a battery control apparatus capable of preventing deviation from a specified range of the electric current and the voltage with respect to all the battery cells and suppressing the battery degradation.

Means to Solve the Problems

In order to achieve the above-described object, the present invention is a battery control apparatus including a battery module and a battery controller, wherein the battery controller includes: a memory; and a control circuit that executes a program recorded in the memory and controls actions of a battery(s) of the battery module, wherein the memory stores battery data including a relation between a DC resistance component(s) and a state of charge and a relation between a polarization resistance component(s) and the state of charge; and wherein the control circuit: estimates a state of health of the battery; and controls the battery by referring to the battery data and extracting the relation between the DC resistance component and the state of charge and the relation between the polarization resistance component and the state of charge on the basis of the estimated state of health of the battery at present.

Advantageous Effects of the Invention

Even when a plurality of battery cells with different degrees of degradation are connected in series, the present invention can provide the battery control apparatus capable of preventing any deviation from a specified range of the electric current and the voltage with respect to all the battery cells and suppressing the battery degradation.

BRIEF DESCRIPTION OF DRAWINGS

FIG. 5 is a diagram illustrating an example of a battery data table;

DESCRIPTION OF EMBODIMENTS

Figure 1:
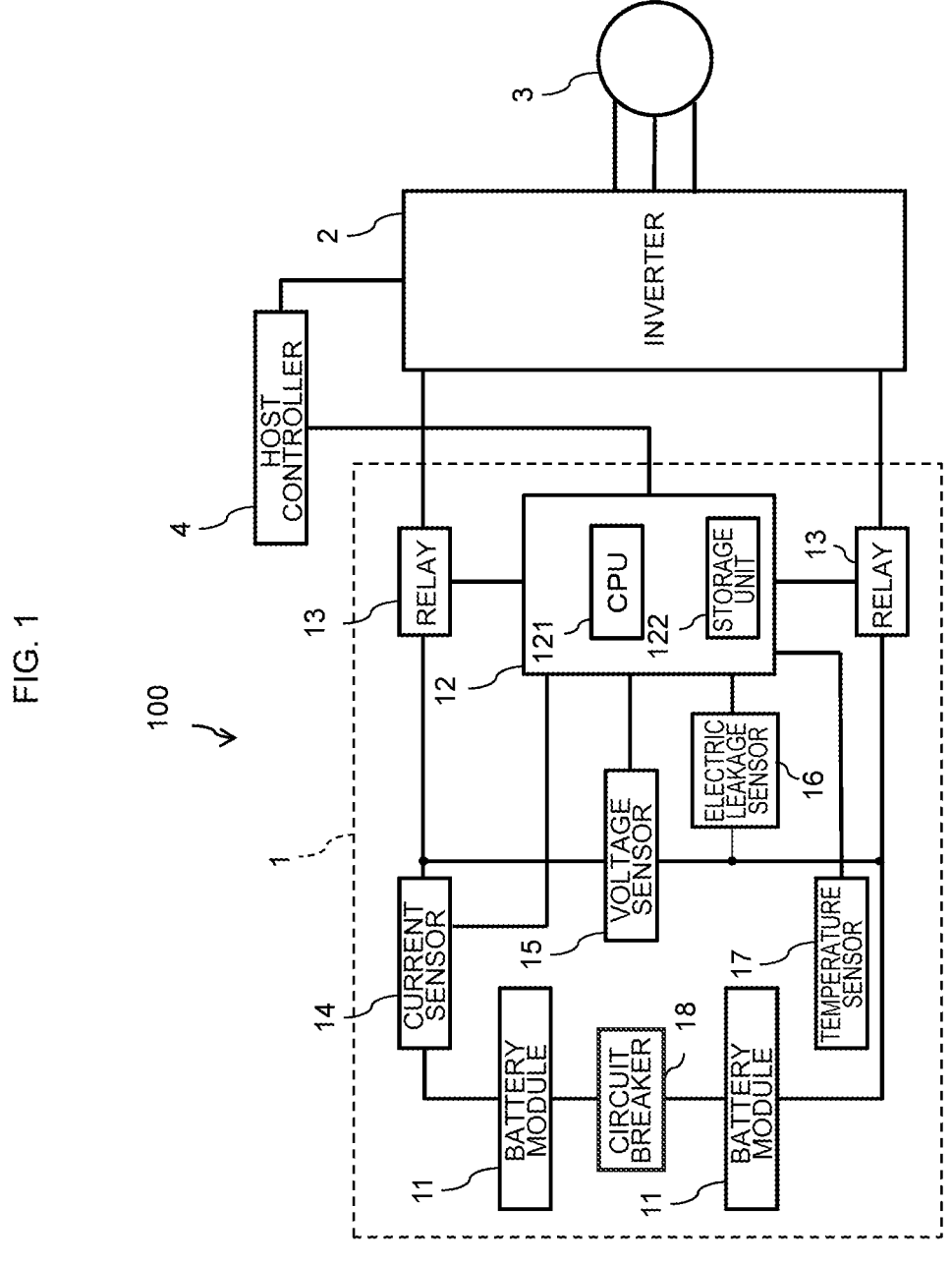
FIG. 1 is an example of a hardware block diagram of a battery system according to an embodiment of the present invention which is used for, for example, electric motor vehicles.

Embodiments of the present invention will be explained with reference to the drawings. FIG. 1 is an example of a hardware block diagram of a battery system 100 for, for example, electric motor vehicles. The battery system 100 includes a battery control apparatus 1, an inverter 2, a load 3 such as a motor, and a host controller 4.

Since an output voltage of the battery control apparatus 1 is a DC voltage which fluctuates due to a remaining capacity, an output electric current, etc. of a battery/batteries, it may not be sometimes appropriate to directly supply electric power to the load 3. So, the inverter 2 converts the output voltage of the battery control apparatus 1 to a three-phase alternating current, which is then supplied to the load 3.

The host controller 4 controls the battery control apparatus 1 and the inverter 2. When the DC voltage and other polyphase current and single-phase current are supplied to the load 3, the battery control apparatus 1 is also configured in the same manner.

When the load 3 outputs the electric power, the electric power which is output from the load 3 can be stored in a battery module 11 in the battery control apparatus 1 by using the inverter 2 as a bidirectional inverter. The battery module 11 can be charged as necessary by connecting the inverter 2 with a charging system in parallel.

The battery control apparatus 1 transmits a charging rate (SOC), a degradation rate (SOH), the maximum charging-discharging current (allowable current value) which can be made to pass through the batteries, the battery temperature, and whether there is any battery anomaly or not, as information about the status of batteries which is useful for control of the inverter 2 and the load 3, to the host controller 4. The host controller 4 performs energy management, anomaly detection, and so on based on these pieces of information. If the host controller 4 determines that the battery control apparatus 1 should be disconnected from the inverter 2 or the load 3, it sends a disconnection instruction to the battery control apparatus 1.

The battery control apparatus 1 includes: battery modules 11; a battery controller 12 that executes control to, for example, monitor and estimate the status of batteries; a relay 13 that causes outputs of the battery control apparatus 1 intermittently; a current sensor 14 that measures the electric current which flows through the battery module 11; a voltage sensor 15 that measures the voltage of the battery module 11; an electric leakage sensor 16 that measures insulation resistance between the battery control apparatus 1 and the ground; a temperature sensor 17 that measures a battery temperature; and a circuit breaker 18 that turns on and off according to the output voltage of the battery control apparatus 1. The battery control apparatus 1 includes a plurality of (two) battery modules which are connected in series via the circuit breaker 18.

The battery controller 12 includes: a CPU (control circuit) 121 that performs various arithmetic operations; and a storage unit (memory) 122 that stores a data table (data structure) explained later.

The battery module 11 has a plurality of unit batteries (battery cells) and includes a circuit that measures the temperature inside the battery module 11, a circuit that measures the voltage of the unit batteries, and a circuit that performs charging/discharging of each unit battery as necessary. Therefore, it is possible to monitor the voltage and adjust the voltage for each unit battery. The battery controller 12 can estimate, judge, or determine the battery status on the basis of temperature information of the unit batteries.

The plurality of battery modules 11 are connected in series; and furthermore, the current sensor 14 and a pair of relays 13 are connected in series. The current sensor 14 measures an electric current value which is necessary for the battery controller 12 to monitor and estimate the status of the battery modules 11.

The battery controller 12 can block or connect the output of the battery control apparatus 1 by controlling opening and closing of the pair of relays 13 according to commands from the host controller 4.

In order to prepare for the battery module 11 to become a high voltage (for example, 100 V), a switch for forcedly manually blocking the input/output of the electric power to/from the battery control apparatus 1 may be added in series with the relay 13. By doing so, it is possible to prevent, for example, a short circuit when assembling or disassembling the battery control apparatus 1 or when dealing with an accident of an apparatus in which the battery control apparatus 1 is mounted.

Regarding the configuration in which a plurality of battery modules 11 are connected in parallel, each line may be provided with the relay 13, the switch, and the current sensor 14. Alternatively, only an output part of the battery control apparatus 1 may be provided with the relay 13, the switch, and the current sensor 14. Furthermore, both of each line and the output part of the battery control apparatus 1 may be provided with the relay 13, the switch, and the current sensor 14.

The relay 13 may be configured from one relay or may be configured from a combination of a main relay, a precharge relay, and a resistor. In the latter configuration, the resistor may be located in series with the precharge relay and they may be connected in parallel with the main relay.

When the battery controller 12 is connected with the relay 13, the precharge relay is firstly connected. The electric current which flows through the precharge relay is limited by the resistor which is connected in series, it is possible to limit an inrush current which may occur in the former configuration. Then, the main relay is connected after the electric current which flows through the precharge relay becomes sufficiently small. The timing to connect the main relay may be based on the electric current which flows through the precharge relay, or may be based on a voltage applied to the resistor or a voltage across terminals of the main relay. Alternatively, the timing to connect the main relay may be based on time elapsed after connecting the precharge relay.

The voltage sensor 15 measures a voltage value which is necessary for the battery controller 12 to monitor and estimate the status of the battery module 11. The voltage sensor 15 is connected in parallel to one battery module 11 or a plurality of battery modules 11.

The battery module 11 is connected to the electric leakage sensor 16 and detects the state where electric leakage may occur before the occurrence of the electric leakage, that is, the state where the insulation resistance has decreased, and thereby prevents the occurrence of an accident.

The current sensor 14, the voltage sensor 15, the temperature sensor 17, and the electric leakage sensor 16 transmit their respective measured values to the battery controller 12. The battery controller 12 monitors and estimates the battery status of the battery module(s) 11 on the basis of the received measured values and, as a result, controls the battery module(s). The "control" includes, for example, charging/discharging of each unit battery to equalize the voltage of each unit battery, control of power sources of the respective sensors, addressing of the respective sensors, and control of the relay(s) 13 connected to the battery controller 12. The CPU 121 performs necessary arithmetic operations to monitor and estimate the battery status and perform the above-mentioned control.

The battery control apparatus 1 may include system cooling fans, which may be sometimes controlled by the battery controller 12. As the battery control apparatus 1 performs cooling, it becomes possible to reduce a communication traffic volume with the host controller 4.

In the example illustrated in FIG. 1, the degree of freedom is realized by making the voltage sensor 15 and the electric leakage sensor 16 as components separate from the battery controller 12; however, they may be configured so that the voltage sensor 15 and the electric leakage sensor 16 are built in the battery controller 12. By doing so, it is possible to reduce the number of harnesses and save the labor to attach the sensors as compared to the case where the individual sensors are prepared. However, the scale of the battery control apparatus 1 which can be dealt with (such as the maximum output voltage, the electric current, and so on) may be limited by having the sensors built-in; and therefore, in that case, it is desirable that the sensors be separate components.

Figure 2:
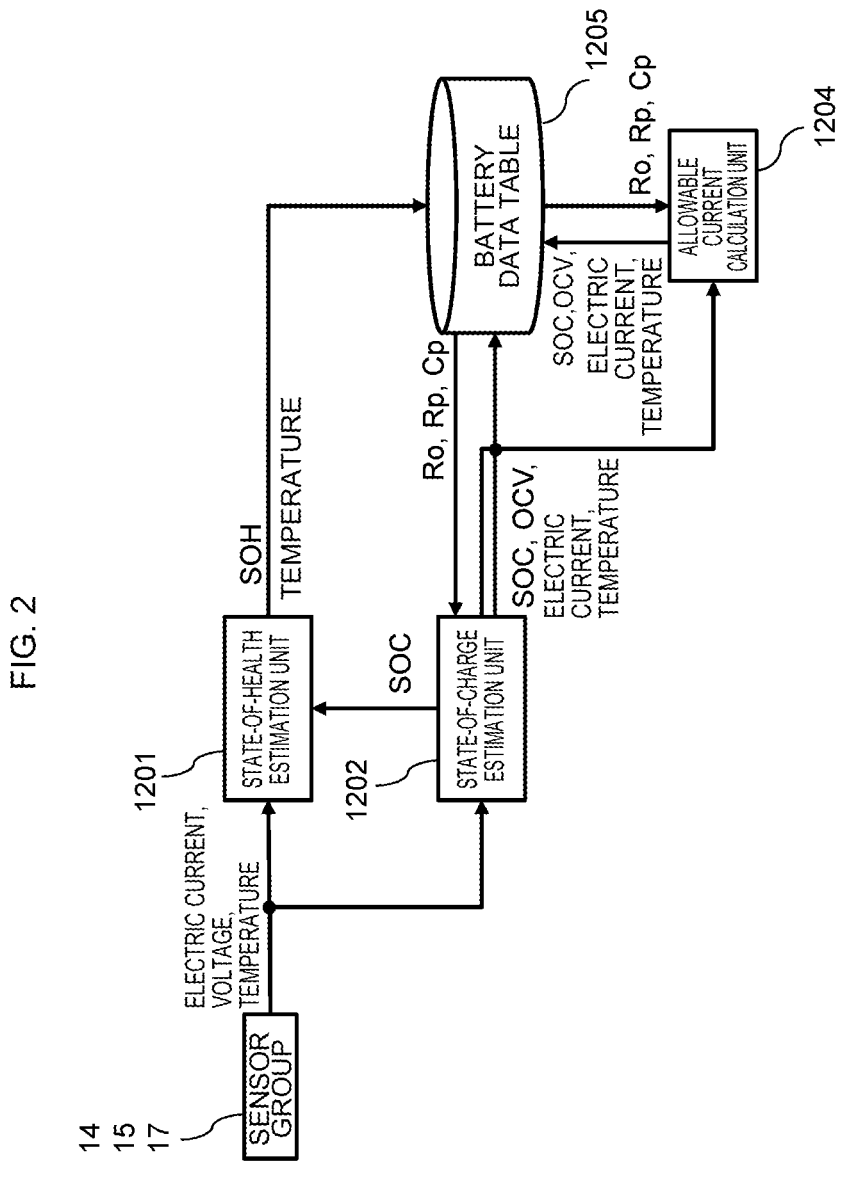
FIG. 2 is an example of a functional block diagram of a battery controller.

FIG. 2 is an example of a functional block diagram of the battery controller 12. The CPU 121 implements a state-of-health estimation unit 1201, a state-of-charge estimation unit 1202, and an allowable current calculation unit 1204 as functional modules by executing programs recorded in the storage unit 122. The "unit" may be rephrased with a function, means, module, unit, circuit, step, or the like. The functional modules may be implemented by hardware such as a semiconductor circuit. The storage unit 122 includes a battery data table 1205.

The respective values of the electric current, the voltage, and the temperature are input from the sensor group of the current sensor, the voltage sensor, the temperature sensor, and so on to the state-of-health estimation unit 1201 and the state-of-charge estimation unit 1202, respectively. The state-of-health estimation unit 1201 estimates the state of health of the batteries on the basis of the electric current I, the voltage V, and the temperature T. The word "estimate" may be rephrased with set, determine, judge, or distinguish. The same applies to the state-of-charge estimation unit 1202.

The state-of-health estimation unit 1201 may adopt, for example, a battery capacity reduction as an index indicating the state of health of the battery/batteries. A method for estimating the battery capacity reduction is, for example, as described below.

The state-of-health estimation unit 1201 integrates a charge-discharge amount Q_AB from time point A to another time point B. Then, the state-of-health estimation unit 1201 calculates OCV_A at the time point A and OCV_B at the time point B and finds the charge-discharge amount Q_AB corresponding to OCV_A and a charge-discharge amount Q'_AB corresponding to OCV_B with reference to the battery data table in the initial state. Then, Q'_AB/Q_AB is defined as a capacity reduction rate. This capacity reduction rate is considered as SOH.

Figure 3A:
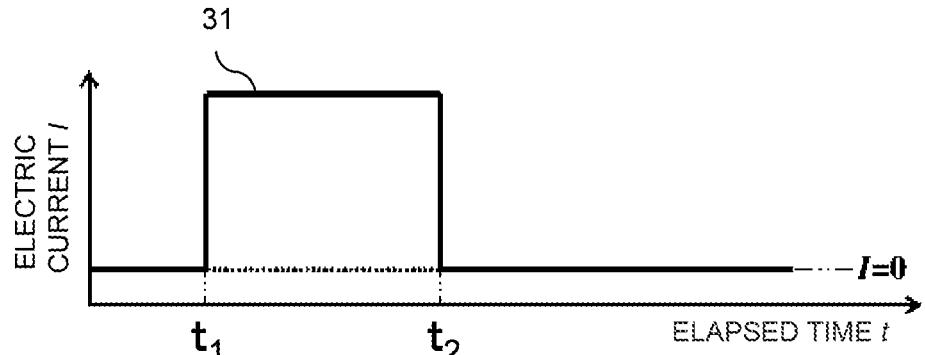
FIG. 3A is a graph illustrating an example of voltage behaviors of a battery/batteries when a rectangular wave current is applied to the battery/batteries; and the graph indicates a rectangular wave current I applied to the battery/batteries.
Figure 3B:
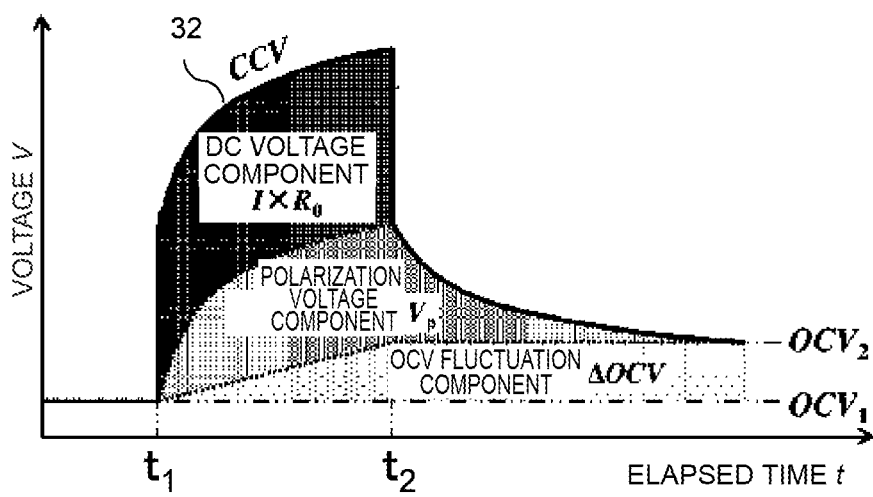
FIG. 3B is a graph illustrating an example of voltage behaviors of the battery/batteries when the rectangular wave current is applied to the battery/batteries; and the graph indicates a voltage V of the battery/batteries.
Figure 4:
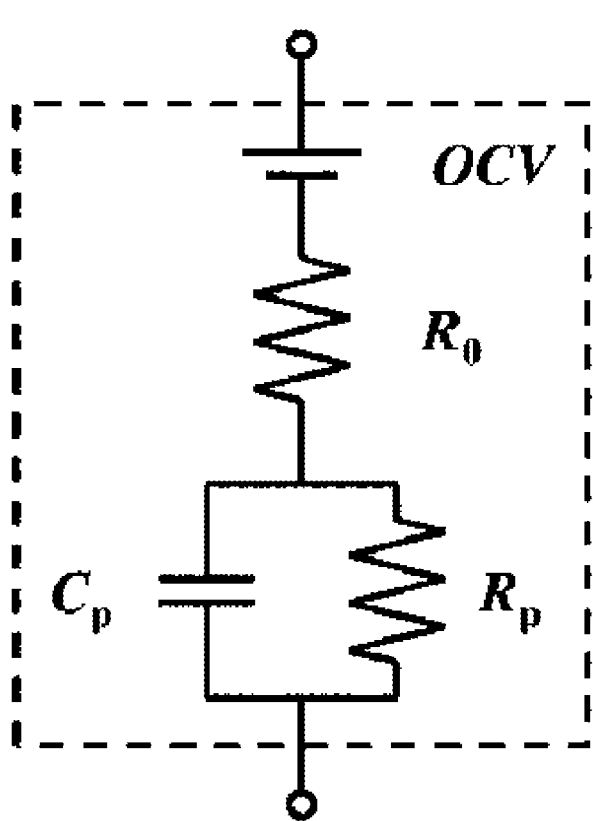
FIG. 4 is a diagram illustrating an example of an equivalent circuit model of the battery/batteries.

The state-of-charge estimation unit 1202 estimates the state of charge of a battery/batteries on the basis of the electric current I, the voltage V, and the temperature T, and an equivalent circuit model of the battery (battery cell). FIG. 3 is a diagram illustrating an example of voltage behaviors of the battery to which a rectangular wave current is applied. FIG. 4 is an example of the equivalent circuit model of the battery. FIG. 3A indicates the rectangular wave current I applied to the battery and FIG. 3B indicates the voltage V of the battery. In each drawing, a horizontal axis is elapsed time.

When the electric current I of, for example, the rectangular waves indicated by a graph 31 in FIG. 3A is applied to the battery, the voltage V of the battery, that is, a CCV (closed circuit voltage) of the battery changes as illustrated as a graph 32 in FIG. 3B. This voltage change is mainly classified into three components, i.e., a DC voltage component I×R0, a polarization voltage component Vp, and an OCV fluctuation component ΔOCV. R0 represents a DC resistance component.

The DC voltage component I×R0 which is the first component instantaneously responds to the change of the electric current I. Specifically, the DC voltage component I×R0 increases instantaneously in response to a rise of the electric current I, remains at a certain level, and then disappears with a fall of the electric current I.

The polarization voltage component Vp which is the second component fluctuates behind the change of the electric current I. Specifically, the polarization voltage component Vp gradually increases after the rise of the electric current I and then gradually decreases after the fall of the electric current I.

The ΔOCV which is the third component corresponds to the difference between OCV1 which is an OCV value before the start of charging and OCV2 which is an OCV value after the start of charging. The ΔOCV corresponds to a change amount of the state of charge of the battery according to the charge-discharge amount.

In FIG. 4, the DC voltage component is calculated by multiplying the DC resistance component R0 by the electric current I. Rp represents a polarization resistance component and Cp represents a polarization capacity component, respectively; and the polarization voltage component Vp is calculated from these values, the electric current I, and charging-discharging time t. The polarization voltage component Vp shows exponential fluctuations based on a time constant RpCp.

As a first method, the state-of-charge estimation unit 1202 arithmetically operates the SOC from the OCV of the battery, which is calculated by analyzing the CCV of the battery on the basis of the equivalent circuit model, by referring to the battery data table described later which indicates the relation between the SOC and the OCV of the battery. As a second method, the SOC may be arithmetically operated from the relation between ΔQ and the SOC on the basis of the charging-discharging electric quantity ΔQ multiplied by the electric current I. The SOC may be arithmetically operated by using a combination of both the above methods.

FIG. 5 is an example of the battery data table 1205. Items of the table include the SOH (%), the temperature T (° C.), the SOC (%), the electric current I (A), the OCV (V), the DC resistance Ro (Ω), the polarization resistance Rp (Ω), and the polarization capacity Cp (F) (or a polarization time constant τp (s)). A function representing data may be used instead of the battery data table.

The battery data table 1205 includes the DC resistance Ro (Ω), the polarization resistance Rp (Ω), and the polarization capacity Cp (F) with respect to each of specified combinations of the temperature T, the SOC, the SOH, and the electric current I which are respectively within a specified range. Specifically, the respective values of the battery DC resistance Ro (Ω), the polarization resistance Rp (Ω), and the polarization capacity Cp (F) are set to each of the plurality of combinations, in which the battery capacity reduction rate (SOH), the battery temperature (T), the battery charging rate (SOC), and the battery current (I) are respectively specified values, in the battery data table. FIG. 5 shows the case where there are N references for the SOH, M references for the SOC, L references for the temperature, and K references for the electric current. The number of the combinations of the OCV, the DC resistance, the polarization resistance, and the polarization capacity is N×M×L×K.

The battery data table in FIG. 5 is decided in advance by experiments and/or simulations. For example, after any one of cells of a battery pack, which has the M references for the SOH (for example, SOH_1), is connected to a charge-discharge apparatus in a thermostatic oven which is set to any one of the temperatures of the L references (for example, T_1) and the SOC is adjusted to any one of the N references (for example, SOC_1), the electric current is set to any one of the K references (for example I_1) and charging or discharging is performed for a certain period of time, and then the obtained CCV behaviors are analyzed, thereby deciding the DC resistance Ro, the polarization resistance Rp, and the polarization capacity Cp. As a result, it is possible to decide the Ro, the polarization resistance Rp, and the polarization capacity Cp corresponding to SOH_1, T_1, SOC_1, and I_1. The battery data table in FIG. 5 can be realized by performing this procedure on the combination of M×N×L×K pieces of the references. The battery data table does not have to exist for each individual battery cell and one battery table may be provided for each battery cell specification (on a manufacturer basis, on a model basis, on a type basis, and so on).

A part or whole of the data table can be replaced with a function(s). For example, temperature dependency of Rp can be approximated as an exponential function such as Rp=A× exp(B/(T+273)) by using A and B as appropriate constants and a part of the data table can be replaced with the exponential function. If the tendency of experimental data can be also approximated as an appropriate function regarding the SOH, the SOC, and the electric current, a part of the data table can be replaced with the function in the same manner.

Figure 6A:
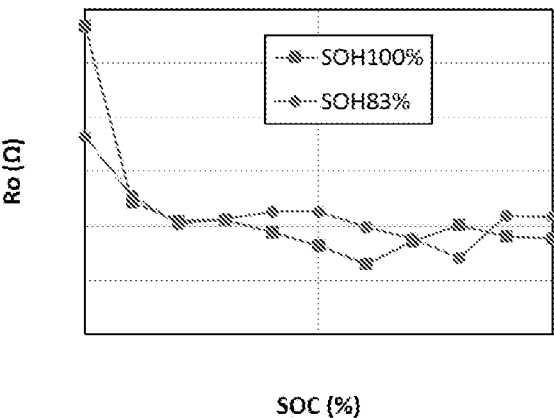
FIG. 6A shows graphs indicating SOC dependency with DC resistance R0 of the battery/batteries at a temperature of 25° C. and with an electric current 1C where the SOH is 100% and 83%.
Figure 6B:
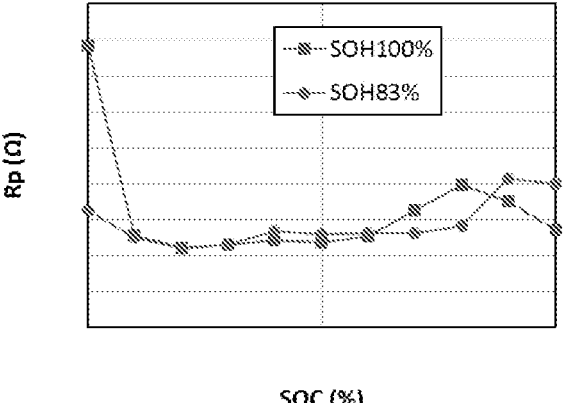
FIG. 6B shows graphs indicating SOC dependency with polarization resistance Rp of the battery/batteries at a temperature of 25° C. and with the electric current 1C where the SOH is 100% and 83%. (A)(B) are graphs indicating the SOC dependency with the DC resistance R0 and the polarization resistance Rp of the battery/batteries at a plurality of SOH.

FIG. 6A shows graphs indicating the SOC dependency of the DC resistance R0 of a battery at the temperature of 25° C. and with an electric current 1C where the SOH is 100% and 83%. FIG. 6B shows graphs indicating the SOC dependency of the polarization resistance Rp at the temperature of 25° C. and with the electric current 1C where the SOH is 100% and 83%. The electric current 1C means an electric current value of the battery which discharges the full capacity in one hour.

The allowable current calculation unit 1204 arithmetically operates an allowable current of the battery by referring to the DC resistance, the polarization resistance, the polarization capacity of the battery, which are stored in the battery data table 1205, on the basis of the current temperature, SOC, and SOH of the battery. The allowable current calculation unit 1204 maintains safety of the battery control apparatus 1 and, at the same time, suppresses rapid degradation of the battery by, as part of a safety function that prevents the battery overvoltage, limiting the electric current so that it will not exceed an allowable current value. Regarding the allowable current for the above-described purpose, examples of arithmetic operations to calculate it will be indicated below.

[Math. 1]

$$Icmax = (Vmax - OCV)/R \qquad \text{(Expression 1)}$$

Icmax is an allowable charge current, Vmax is an upper limit voltage, and R is internal resistance of the battery.

An allowable discharge current is calculated by using Expression (2) below.

[Math. 2]

$$Idmax = (OCV - Vmin)/R \qquad \text{(Expression 2)}$$

Idmax is an allowable discharge current, Vmin is a lower limit voltage, and R is the internal resistance of the battery.

R is calculated by using, for example, Expression (3) below.

[Math. 3]

$$R = Ro + Rp(1 - e^{-t/RpCp}) \qquad \text{(Expression 3)}$$

Ro, Rp, and Cp are obtained from the battery data table 1205. The letter "t" represents time (seconds). In order to select Ro, Rp, and Cp from the database, it is necessary to designate the electric current. So, for example, there is a method for simply calculating the allowable current by using Ro, Rp, and Cp in the specified electric current. Furthermore, for example, there is also a method for searching for the allowable current which satisfies Expression (1) to Expression (3) without any contraction, by repeating extraction of Ro, Rp, and Cp and the calculations of Expression (1) to Expression (3) while changing the designated electric current.

The allowable current calculation unit 1204 arithmetically operates allowable input and allowable output of the battery on the basis of the DC resistance, the polarization resistance, and the polarization capacity of the battery, which are stored in the battery data table 1205.

The allowable input is calculated by Expression (4) below.

[Math. 4]

$$Ic_{max} * V_{max} \qquad \text{(Expression 4)}$$

The allowable output is calculated by Expression (5) below.

[Math. 5]

$$Id_{max} * V_{min} \qquad \text{(Expression 5)}$$

Next, actions of the battery control apparatus will be explained. In the initial state of the battery, the DC resistance component, the polarization resistance component, and the polarization capacity component of the battery are respectively associated with the temperature, the SOC, the SOH, and the electric current in the battery data table illustrated in FIG. 5.

Subsequently, the battery is used from the initial state of the battery and the state-of-health estimation unit 1201 updates the current SOH of the battery, for example, when starting the engine, when charging the battery with an external power source, or upon a periodic inspection. After that, an equivalent circuit parameter table corresponding to the updated SOH is used.

The state-of-charge estimation unit 1202 arithmetically operates the SOC based on the relation between the charging-discharging electric quantity and the SOC on the basis of the charging-discharging electric quantity ΔQ obtained by integrating the electric current I detected by the current sensor 14. Alternatively, the state-of-charge estimation unit 1202 arithmetically operates the SOC on the basis of the OCV of the battery found while not in operation, and the relation between the SOC and the OCV. Alternatively, the state-of-charge estimation unit 1202 arithmetically operates the SOC by using any one of the OCV, the DC resistance, the polarization resistance, and the polarization capacity which are obtained by analyzing detected values of the current sensor 14 and the voltage sensor 15 with the equivalent circuit model. Alternatively, the state-of-charge estimation unit 1202 arithmetically operates the SOC by combining these multiple arithmetic operation methods.

Next, the allowable current calculation unit 1204 arithmetically operates the allowable charge current and the allowable discharge current of the battery by using Expressions (1) to (3) on the basis of the DC resistance, the polarization resistance, and the polarization capacity of the battery, which are stored in the battery data table 1205. Furthermore, the allowable current calculation unit 1204 (arithmetically operates the allowable input Iin and the allowable output Iout by using Expressions (4) and (5).

The allowable current calculation unit 1204 executes the above-described arithmetic operations of the allowable current and the allowable input/output with respect to all the battery cells which constitute the battery module (the battery pack). Under this circumstance, the temperature, the SOC, and the SOH of the individual battery cells are different, so that the allowable current and the allowable input/output are different for each battery cell. The allowable current calculation unit 1204 selects an electric current whose absolute value is the minimum among the allowable currents of the battery cells of one group connected in series in the battery module (the battery pack) and decides the selected electric current as the allowable current for this series battery cell group.

The following operational advantage can be obtained according to the above-explained embodiment. Regarding a plurality of batteries in a degraded state, the battery control apparatus 1: extracts parameters including the DC resistance component and the polarization resistance component of the batteries at the present time point from the battery data table including the relation between the DC resistance component and the state of charge and the relation between the polarization resistance component and the state of charge in accordance with the battery data table including the relation between the DC resistance component and the state of charge and the relation between the polarization resistance component and the state of charge, the state-of-health estimation unit 1201 which estimates the current state of health of the batteries, and the current state of health of the batteries which is estimated by the state-of-health estimation unit 1201 (; and arithmetically operates the allowable current of the battery cells on the basis of these parameters.

The minimum value of the allowable currents of the battery cells which constitute the series group is set as the allowable current of the entire series group. Accordingly, when the battery cells with different degrees of degradation are connected in series, it is possible to prevent the deviation from a specified range of the electric current and the voltage with respect to all the battery cells and suppress any battery degradation.

Furthermore, in the aspect where the battery module has the configuration such that a plurality of groups, in each of which a plurality of battery cells are connected in series, are connected in parallel, the allowable current calculation unit 1204 sets an allowable current to each of the plurality of groups and decides the total sum of allowable currents of the respective groups as an allowable current of the battery module.

The present invention is not limited to the aforementioned embodiments; and other embodiments which can be thought of within the scope of the technical idea of the present invention are included within the scope of the present invention unless they impair the features of the present invention.

REFERENCE SIGNS LIST

1: battery control apparatus
2: inverter
3: load

4: host controller
11: battery module
12: battery controller
13: relay
14: current sensor
15: voltage sensor
16: electric leakage sensor
17: temperature sensor
18: circuit breaker
100: battery system
121: CPU
122: storage unit

The invention claimed is:

1. A battery control apparatus comprising:
a battery module comprising a plurality of batteries, and
a battery controller, the battery controller including:
   a memory; and
   a control circuit that executes a program recorded in the memory and controls actions of each of the batteries of the battery module,
wherein the memory stores battery data including a relation between a DC resistance component and a state of charge and a relation between a polarization resistance component and the state of charge; and
wherein the control circuit:
   estimates a state of health of each of the batteries based on a calculated battery capacity reduction rate, wherein the control circuit is configured to update the estimated state of health of each of the batteries each time the batteries are charged or a device powered by the batteries is powered on,
   determines allowable currents for each of the batteries by referring to the battery data and extracting the relation between the DC resistance component and the state of charge and the relation between the polarization resistance component and the state of charge on the basis of the estimated state of health of the battery at present,
   sets the allowable current for each of the batteries to be a current whose absolute value is a minimum of the determined allowable currents, and
   charges or discharges each of the batteries based on the set allowable current.

2. The battery control apparatus according to claim 1, comprising:
   a current sensor that measures an electric current (I) of the battery module;
   a voltage sensor that measures a voltage (V) of the battery module; and a temperature sensor that measures a temperature (T) of each of the batteries of the battery module,
wherein the control circuit calculates a capacity decrease rate of each of the batteries on the basis of the electric current (I), the voltage (V), and the temperature (T) and estimates the state of health of the battery.

3. The battery control apparatus according to claim 2,
wherein the control circuit estimates the state of charge of the battery on the basis of the electric current (I), the voltage (V), the temperature (T), and an equivalent circuit model of the battery.

4. The battery control apparatus according to claim 3,
wherein the memory includes a battery data table as the battery data; and
wherein items of the battery data table include the battery capacity reduction rate (SOH), a battery temperature (T), a battery charging rate (SOC), a battery current (I), battery DC resistance (Ro), battery polarization resistance (Rp), and a battery polarization capacity (Cp).

5. The battery control apparatus according to claim 4,
wherein respective values of each of the batteries DC resistance Ro ($\Omega$), the polarization resistance Rp ($\Omega$), and the polarization capacity Cp (F) are set to the battery data table with respect to each of a plurality of combinations in which the battery capacity reduction rate (SOH), the battery temperature (T), the battery charging rate (SOC), and the battery current (I) are respectively specified values.

6. The battery control apparatus according to claim 5,
wherein the control circuit arithmetically operates the allowable current of each of the batteries on the basis of the battery capacity reduction rate (SOH), the battery temperature (T), and the battery charging rate (SOC) at present by referring to the battery DC resistance (Ro), the battery polarization resistance (Rp), and the battery polarization capacity (Cp) which are stored in the battery data table.

7. The battery control apparatus according to claim 6,
wherein the batteries are connected in series.

8. The battery control apparatus according to claim 6,
wherein the battery module has a configuration such that a plurality of groups, in each of which a plurality of battery cells are connected in series, are connected in parallel; and
wherein the control circuit sets allowable currents to the plurality of groups, respectively, and sets a total sum of the allowable currents of the respective groups as an allowable current of the battery module.

* * * * *